United States Patent [19]

Nishino

[11] Patent Number: 5,732,340
[45] Date of Patent: Mar. 24, 1998

[54] FM RECEIVER

[75] Inventor: Yasuji Nishino, Tokyo, Japan

[73] Assignee: Sony Corporation, Tokyo, Japan

[21] Appl. No.: 714,278

[22] Filed: Sep. 17, 1996

[30] Foreign Application Priority Data

Sep. 19, 1995 [JP] Japan .................................. 7-264754

[51] Int. Cl.[6] .................................................. H04B 1/16
[52] U.S. Cl. .................................. 455/212; 455/221
[58] Field of Search .................................. 455/200.1, 212,
455/213, 214, 218, 219, 220, 221, 222,
295, 296, 336, 337, 338, 186.1; 375/346,
351

[56] References Cited

U.S. PATENT DOCUMENTS 4,914,715  4/1990  Miyata .................................. 455/212
5,204,973  4/1993  Sugayama .............................. 455/212
5,255,319  10/1993 Nakamura ............................. 455/222

*Primary Examiner*—Reinhard J. Eisenzopf
*Assistant Examiner*—Thanh Le
*Attorney, Agent, or Firm*—Jay H. Maioli

[57] ABSTRACT

An FM receiver capable of instantaneous muting while receiving a broadcast includes a switch circuit provided in series in an audio signal line in the front end of a deemphasizing capacitor, a variable impedance element connected to the capacitor in parallel, and a waveform shaping circuit for smoothing the rise and fall of a muting signal, wherein the muting signal is fed to the switch circuit as a control signal to turn the switch circuit off during the muting signal period, and wherein an output signal of the waveform shaping circuit is fed to the variable impedance element to change the impedance of the variable impedance element correspondingly to the level of output signal of the waveform shaping circuit.

3 Claims, 3 Drawing Sheets

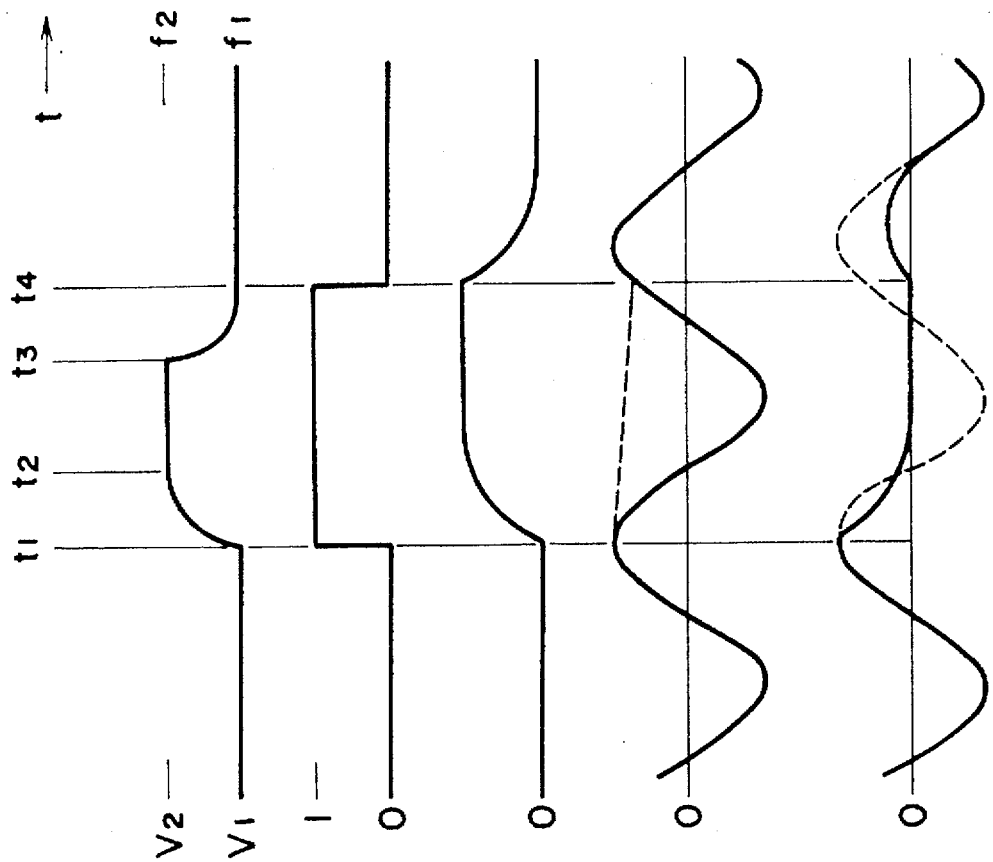

FM RECEIVER

BACKGROUND OF THE INVENTION

1. Field of the Invention

This invention relates to an FM receiver which utilizes, for example, radio data system (RDS) data.

2. Description of Related Art

Some FM broadcasting stations in Europe provide RDS service. The RDS service involves broadcasting of primitive audio signal added with data referred as RDS data. The RDS data are a grouped digital data associated with the broadcasting station and broadcast program, and RDS data include;

PI code . . . broadcasting station identification code,

PTY code . . . identification code for identification of a program,

PS data . . . character data for identification of the name of the broadcasting station, and AF list . . . list of alternative frequencies.

PI code is a sixteen bit code including country code and program code, and transmitted eleven times for every second. PTY code is a five bit code for identification of type of the program such as news, pop music, education, sports, and information. AF list is a list of frequencies of broadcasting stations which are broadcasting the same program as currently received, that is, the list of alternative frequencies.

RDS data is subjected to an encode processing for error correction, then a subcarrier signal with a frequency of 57 kHz (this frequency is three times that of stereopilot signal with a frequency of 19 kHz) is balanced-modulated with the encoded RDS data, the balanced-modulated signal is added to a primary monophonic signal or stereocomposite signal for frequency multiplexing, main carrier signal is frequency-modulated with the multiplexed signal and then broadcasted.

Therefore, for example, when traveling by a car and receiving disturbance from the currently receiving broadcasting station becomes serious as the car travels, another broadcasting station which is broadcasting the same program receivable without disturbance can be selected automatically. For example, it is possible to tune solely to sport programs.

To seek the broadcasting station which is broadcasting the same program as currently being received and the program broadcasted from which broadcasting station is receivable without disturbance, in a PLL synthesizer type receiver, for example, following successive processing should be operated.

(1) Receives a broadcasting of an alternative frequency referring to the AF list of RDS data.

(2) Measures the receiving level of the broadcasting of the alternative frequency.

(3) When the received level in the step (2) is lower than a prescribed value, the receiving frequency is reset to the original frequency.

(4) When the received level in the step (2) is not lower than a prescribed value, the receiving frequency is maintained at the current frequency.

However, during the operation of this processing, the sound based on the broadcasted audio signal can not be outputted normally, therefore it is necessary to mute audio signals.

FIG. 3 shows the waveform of each signal during the muting, as shown in FIG. 3A, it is assumed that the tuning voltage VT is constant at V1 before the time t1, and a broadcasting with a frequency (original frequency) of f1 is tuned correspondingly to the value V1. Therefore, as shown in FIG. 3B, the muting is OFF before the time t1.

However, at the time t1, the muting changes to ON, and the tuning voltage VT starts to change. At the time t2, the tuning voltage VT is stabilized to the value V2, then the receiving frequency is switched to alternative frequency f2.

The measurement of the receiving level of the alternative frequency f2 starts from the time t2. The measurement continues and at the end point of the measurement at the time t3, if the case corresponds to the processing (3), the tuning voltage VT returns gradually to the original value V1.

At the time t4, the tuning voltage VT returns completely to the original value V1, simultaneously the receiving frequency also returns to the original frequency f1, then the muting is turned to OFF at the time t4. If the case corresponds to the processing (4), the muting is turned to OFF at the time t3.

Therefore, for example, if the case corresponds to the processing (3), the period from t1 to t4 is a muting period, and while, for example, audio signal as shown in FIG. 3C is broadcasted at the original frequency f1 and the audio signal is fed to the speaker of a receiver, the signal D lacks output during the period from t1 to t4 because of the muting. (If the case corresponds to the processing (4), the period from t1 to t3 is a muting period, and the signal lacks output during the period from t1 to t3)

For commercially available products, usually the muting period from t1 to t4, namely audio signal lacking period from t1 to t4, is about five msec for products with shorter muting period and about twenty msec for products with longer muting period.

As described herein above, the audio signal lacking time during from t1 to t4 is designed so short that anyone can not sense it in hearing, in other words, the quick change of the receiving frequency and quick measurement of the receiving level are incorporated in the design so that the lacking period from t1 to t4 is inconspicuous.

However, the level change of the audio signal (FIG. 3D) at t1 and t4 is so rapid that the change accompanies the generation of significant harmonic component, and as shown in FIG. 3D, if the level of the audio signal is high at the time t1 or t4, the harmonic component disturbs the sound as noise.

The present invention is accomplished to solve such problem.

SUMMARY OF THE INVENTION

To solve the problem, a FM receiver capable of instantaneous muting while receiving a broadcast in accordance with the present invention includes;

a switch circuit provided in series in an audio signal line in the front end of the deemphasizing capacitor, a variable impedance element connected to the capacitor in parallel, and a waveform shaping circuit for shaping the rising and falling of a muting signal to a gentle change, wherein the muting signal is fed to the switch circuit as a control signal to turn the switch circuit off during the muting signal period, and an output signal of the waveform shaping circuit is fed to the variable impedance element to change the impedance of the variable impedance element correspondingly to the level of output signal of the waveform shaping circuit.

According to the present invention, at the starting and ending of muting, the level of audio signal changes gently, so harmonic components are eliminated.

BRIEF DESCRIPTION OF THE DRAWINGS

FIGS. 2A–2E are a waveform for illustrating the operation of the present invention.

DETAILED DESCRIPTION OF THE PREFERRED EMBODIMENTS

Figure 1:
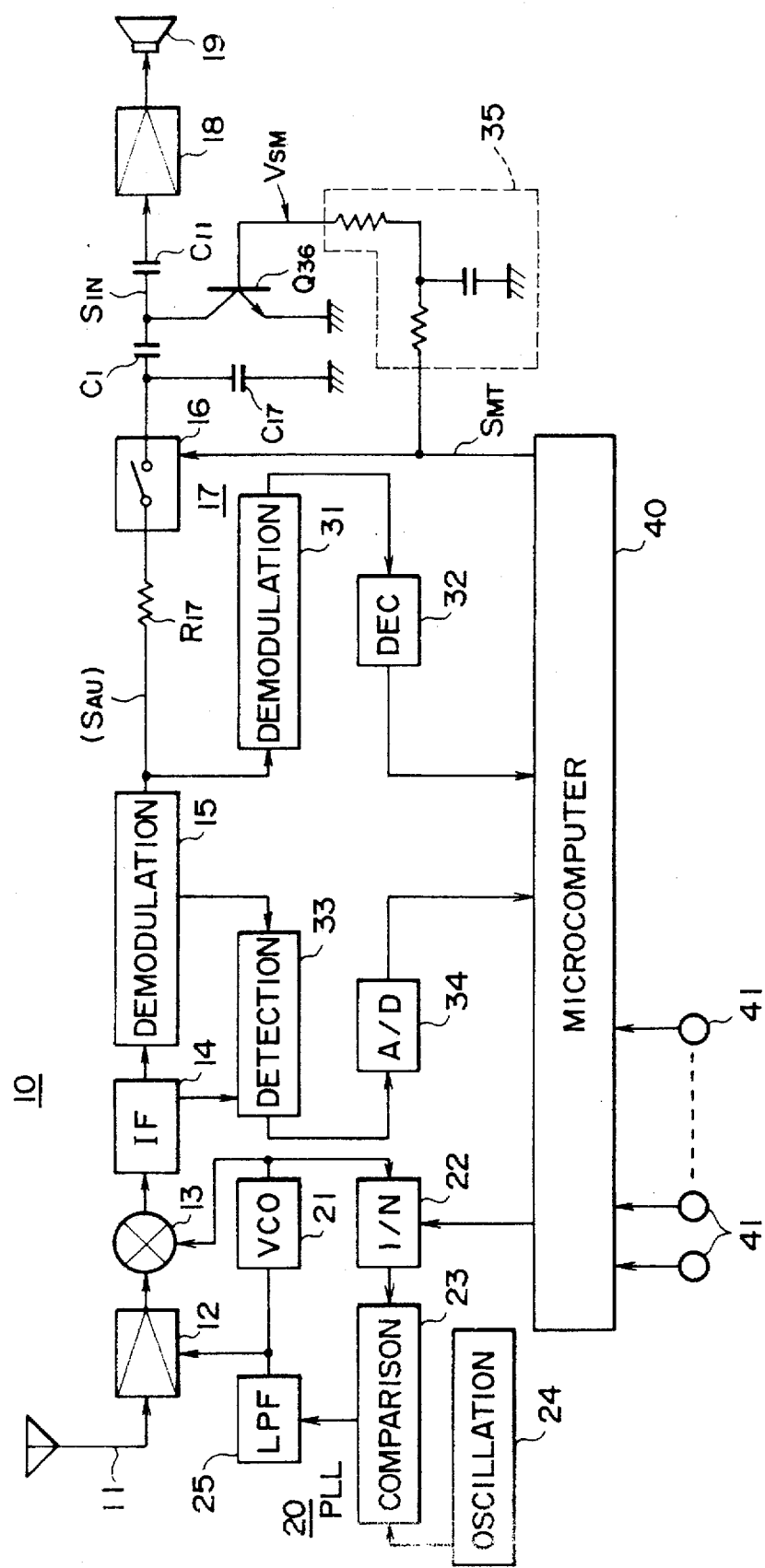
FIG. 1 is a block diagram for illustrating an embodiment for the present invention.
Figures 3A, 3B, 3C, 3D:
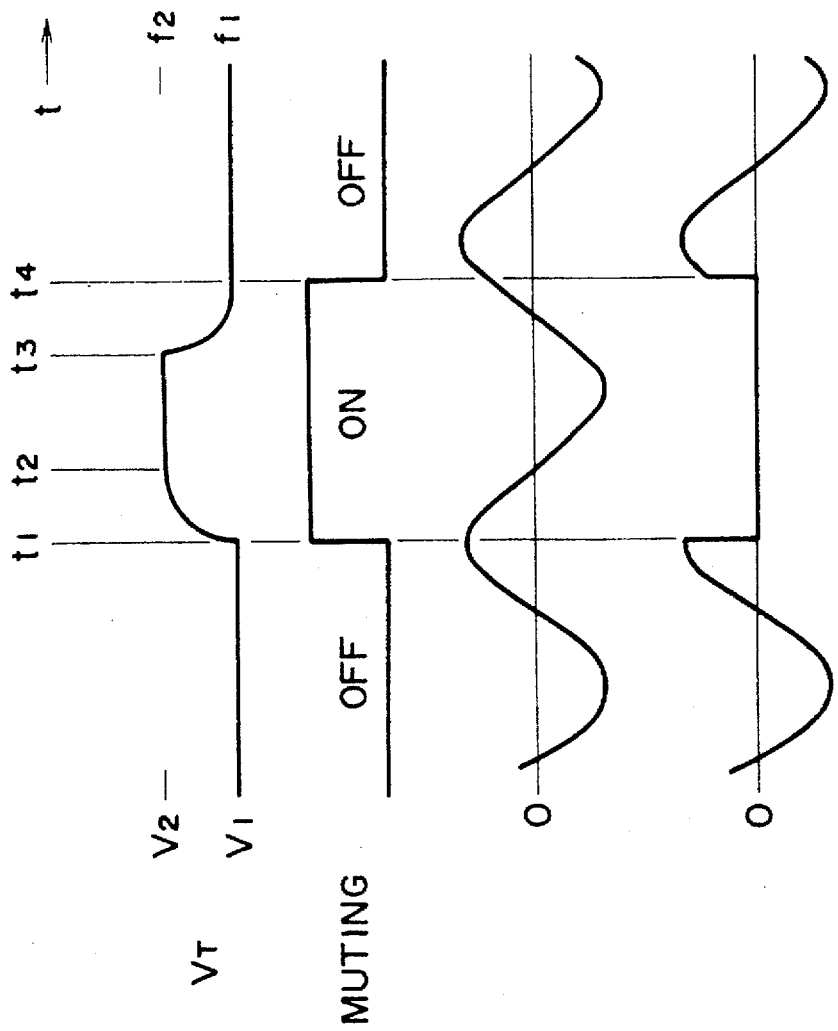
FIGS. 3A–3D are a waveform for illustrating the present invention.

In FIG. 1, a numeral 10 represents a receiving circuit of FM broadcasting. The receiving circuit 10 has a synthesizer type structure, and in which a received signal from an antenna 11 is fed to a mixer circuit 13 through a high frequency amplifier 12. An oscillating signal having a prescribed frequency is outputted from VCO 21 of PLL 20, then the oscillating signal is fed to the mixer circuit 13 as a local oscillating signal, and the receiving signal having an addressed frequency is frequency-changed to a medium frequency signal in the mixer circuit 13.

The intermediate frequency signal is fed to FM demodulator circuit 15 through the intermediate frequency circuit 14 having an intermediate frequency filter and wide band amplifier, and an audio signal (monophonic signal or stereocomposite signal) is outputted.

The audio signal output is fed to a speaker 19 through a signal line of a resistor R17, switch circuit 16 for level holding, capacitors C1 and C11 for DC cutting, and low frequency amplifier 18. A capacitor C17 is connected in parallel to a signal line of the output side of the switch circuit of 16, the capacitor C17 and resistor R17 constitute a deemphasizing circuit 17. The switch circuit 16 is structured with a mechanical switch or C-MOS switch.

PLL 20 comprises circuits 21 to 25. A signal from VCO 21 is fed to the variable frequency dividing circuit 22 and an oscillating circuit 24 outputs an oscillating signal having a reference frequency of, for example, 100 Hz, the oscillating signal is fed to a comparator, the comparison output is fed to VCO 21 through a low pass filter 25 as a control voltage, and also an output voltage of the filter 25 is fed to a tuning circuit of a high frequency amplifier 12 as a tuning voltage.

By changing the frequency dividing ratio N of the variable frequency dividing circuit 22 which constitutes partially PLL 20, the oscillating signal frequency of VCO 21 changes correspondingly to the change, therefore the broadcasting having the frequency corresponding to the frequency dividing ratio N is received.

The demodulating circuit 15 outputs a modulated signal modulated with RDS data, the modulated signal is fed to a demodulating circuit 31 to modulate RDS data, the RDS data are fed to a decoding circuit 32, and the decoding circuit 32 outputs error-corrected RDS data.

Partial intermediate frequency signal and partial FM demodulating output from the intermediate frequency circuit 14 and demodulating circuit 15 respectively are fed to a level detection circuit 33, the level detection circuit outputs a detection signal for identifying the receiving level of a received signal (received electric field intensity), and the detection signal is fed to an A/D converter to convert it to a digital detection signal.

A numeral 40 represents a microcomputer for serving as a system control device. The microcomputer 40 is incorporated with a CPU, ROM storing various processing routines, RAM for the work area, and ports for input and output though these are not shown in the figure.

Various operational keys 41 are connected to the microcomputer 40.

Frequency dividing ratio N data are fed from the microcomputer 40 to the variable frequency dividing circuit 22 of PLL 20 and the data are set in the variable frequency dividing circuit 22. RDS data from the decoding circuit 32 are fed to the microcomputer 40, and also the receiving level detection signal from the A/D converter is fed to the microcomputer 40.

The microcomputer 40 outputs a rectangular wave muting signal SMT with the level "1" during the period from t1 to t4 as shown in FIG. 2B, the SMT signal is fed to the waveform shaping circuit 35 comprising a low pass filter having a resistor and capacitor, the output voltage VSM is fed to the base of a muting transistor Q36. The collector-emitter of the transistor Q36 is AC connected in parallel to the capacitor C17.

The muting signal SMT from the microcomputer 40 is fed to the switching circuit 16 as a control signal, and the switching circuit 16 is turned ON and OFF when SMT is "0" and "1" respectively.

In such structure, it is assumed that, before the time t1, the tuning voltage (control voltage of VCO 21) VT is constant at a value of V1, and a broadcasting having a frequency of f1 (original frequency) is being received correspondingly to V1 as shown in FIG. 2A.

In detail, before the time t1, the muting signal SMT is "0" as shown in FIG. 2B, and the output voltage VSM of the shaping circuit 35 is "0" as shown in FIG. 2C, therefore the transistor Q36 is OFF and the muting is OFF. Because SMT="0", the switching circuit 16 is ON. Therefore, the audio signal from the demodulator 15 is de-emphasized by the deemphasizing circuit 17, then fed to the speaker 19 through the amplifier 18, thus a received broadcasting can be heard.

When, if the audio signal broadcasted with a frequency of f1 is a signal SAU having the voltage waveform, for example, as shown in FIG. 2E, the audio signal SIN inputted to the amplifier 18 before the time t1 has a voltage waveform as shown in FIG. 2E, and is equal to the voltage waveform of the signal SAU.

However, at the time t1, STM="1", then the switching circuit 16 is turned OFF from the time t1. Upon turning the switching circuit OFF at the time t1, the voltage value of the signal SAU at the time t1 is held by the capacitor C17. The held voltage value is to be inputted to the amplifier 18.

However, at the time t1, because of SMT="1", the level of the output voltage VSM of the shaping circuit 35 rises gradually as shown in FIG. 2C, and the voltage VSM is fed to the base of the transistor Q36. Therefore, the impedance between collector and emitter of the transistor Q36 decreases gradually from the time t1. As the result, the voltage value held in the capacitor C17 is discharged through the transistor Q36, the audio signal SIN fed to the amplifier 18 has a waveform with a gradual decreasing profile from the time t1 as shown in FIG. 2E with a solid line.

The frequency dividing ratio N of the variable frequency dividing circuit 22 is changed, then the tuning voltage VT starts to change from the time t1 as shown in FIG. 2B. At the time t2, the tuning voltage VT is stabilized at the value V2, and the receiving frequency is switched to an alternative frequency f2.

From the time t2, the detection signal from the A/D converter 34 is fed to the microcomputer 40, and the receiving level at the alternative frequency f2 is measured.

The measurement continues and ends at the time t3, and at the time t3, if the case corresponds to the processing (3), the tuning voltage VT changes gradually to the original value V1.

When the tuning voltage VT returns to the original value V1 at the time t4, correspondingly the receiving frequency returns to the original frequency f1.

At the time t4, SMT="0". As the result, the switching circuit is turned ON from the time t4, this operation allows the switching circuit 16 to output an audio signal SAU.

Upon SMT ="0" at the time t4, the output voltage VSM from the shaping circuit 35 starts to decrease gradually from the time t4 as shown in FIG. 2C, therefore the impedance between collector and emitter of the transistor Q36 rises gradually from the time t4.

As the result, the audio signal SIN fed to the amplifier 18 rises gradually in its level from the time t4 as shown in FIG. 2E with a solid line, and then returns to the original level. (if the case corresponds to the processing (4), the muting is turned to OFF at the time t3)

Therefore, the receiving level of an alternative frequency f2 is checked during the period from t1 to t4, though the audio signal SAU is off during the period from t1 to t4, the audio signal SIN fed to the amplifier changes gently at the time t1 and t4. Therefore, the audio signal SIN contains no harmonic component at the time t1 and t4, and no noise is generated at the time t1 and t4.

According to the receiving circuit 10 described herein above, regardless of muting operation at the time t1 and t4 for checking the receiving level of an alternative frequency f2, no noise is generated at the starting of muting at t1 and ending at t4.

In addition in such case, the level of the audio signal SAU is held by the capacitor C17 at the time t1, because the capacitor C17 is a capacitor for deemphasizing, the high frequency performance of the audio signal SIN is maintained at high level even if the capacitor C17 is connected continuously. The control circuit to connect a capacitor for holding only when muting is not necessary, thereby extra circuits and parts are not necessary.

In the above description, the present invention is described referring to the application to a FM receiver having capability of receiving RDS data, but the present invention can also be applied to antenna diversity receiving. In detail, in the case of antenna diversity receiving, after switching antenna, generally the receiving level is high, therefore the level of audio signal occasionally rises rapidly when switching, for such case the present invention can be applied.

According to the present invention, no noise is generated at the starting and ending of muting when muting is operated.

The capacitor used for the purpose is originally a capacitor for de-emphasis, therefore the high frequency performance of audio signal is maintained at high level. Extra circuits and parts are not necessary to apply the present invention.

What is claimed is:

1. An FM receiver for instantaneous muting during reception of a broadcast, comprising:

a de-emphasis capacitor;

a switching circuit provided in series with an audio signal line in a front end of said de-emphasis capacitor;

a variable impedance element connected in parallel to said de-emphasis capacitor;

a waveform shaping circuit for smoothing the rise and fall of a muting signal into a smoothed output signal and for feeding said smoothed output signal to said variable impedance element; and control means for controlling said switching circuit by feeding said muting signal to said switching circuit, wherein an impedance of said variable impedance element is changed correspondingly to a level of said smoothed output signal of said waveform shaping circuit.

2. The FM receiver as claimed in claim 1, wherein said FM receiver is a PLL synthesizer FM receiver for receiving RDS service including a detection circuit for detecting a first receiving level of a first receiving frequency, and said control means controls an operation in which when the muting starts with said muting signal, the first receiving frequency is changed to a second receiving frequency, a second receiving level of said second receiving frequency is detected by said detection circuit, and if said second receiving level is lower than said first receiving level, said control means selects said first receiving frequency and cancels said muting signal.

3. The FM receiver as claimed in claim 1, wherein said FM receiver is a PLL synthesizer type FM receiver for receiving RDS service including a detection circuit for detecting a first receiving level of a first receiving frequency, and said control means controls an operation in which when the muting starts with said muting signal, the first receiving frequency is changed to a second receiving frequency, a second receiving level of said second receiving frequency is detected by said detection circuit, and if said second receiving level is higher than said first receiving level, said muting signal is canceled and said second receiving signal is selected by said control means.

* * * * *